United States Patent [19]
Jackson

[11] Patent Number: 5,187,445
[45] Date of Patent: Feb. 16, 1993

[54] TUNING CIRCUIT FOR CONTINUOUS-TIME FILTERS AND METHOD THEREFOR

[75] Inventor: H. Spence Jackson, Austin, Tex.

[73] Assignee: Motorola, Inc., Schaumburg, Ill.

[21] Appl. No.: 783,608

[22] Filed: Oct. 28, 1991

[51] Int. Cl.$^5$ .......................... H03B 1/00; H03B 1/04; H03K 5/00

[52] U.S. Cl. .................................. 328/167; 328/151; 307/521; 330/109; 333/173

[58] Field of Search ................. 328/167, 151; 307/520, 307/521; 331/107, 109; 333/173, 178

[56] References Cited

U.S. PATENT DOCUMENTS

| | | | |
|---|---|---|---|
| 4,443,757 | 4/1984 | Bui | 333/173 |
| 4,791,379 | 12/1988 | Hughes | 328/167 |
| 4,866,400 | 9/1989 | Britton, Jr. et al. | 328/167 |

OTHER PUBLICATIONS

Gerger et al., "Switched-Resistor Filters-A Continuous Time Approach to Monolithic MOS Filter Design", IEEE Trans. on Circuits & Systems, vol. CAS-29, No. 5, May 1982, pp. 306-315.

Gregorian, R. and Temes, G., Analog MOS Integrated Circuits for Signal Processing, John Wiley & Sons, New York, 1986, pp. 400-401.

*Primary Examiner*—Timothy P. Callahan
*Attorney, Agent, or Firm*—Paul J. Polansky; Maurice Jay Jones

[57] ABSTRACT

A tuning circuit (30) provides selection signals to a passive component array (80) in a continuous-time filter (70) to compensate for wide variations in values which are encountered in integrated circuit processing. The tuning circuit (30) includes at least one capacitor (46) and at least one resistor (31), and a plurality of either capacitors or resistors. A largest component is enabled and an integration of a reference current during a predetermined period is performed. If the integration provides a voltage greater than a reference voltage, then a corresponding selection signal is set and the component is selected. Successive integrations are performed to determine which components are enabled by corresponding selection signals in order to enable a combination of components which most closely integrates the reference current to the reference voltage. When selection signals corresponding to all components have been determined, the selection signals are applied to corresponding components in the filter (70).

13 Claims, 3 Drawing Sheets

TUNING CIRCUIT FOR CONTINUOUS-TIME FILTERS AND METHOD THEREFOR

FIELD OF THE INVENTION

This invention relates generally to analog filters, and more particularly, to tuning circuits for continuous-time, analog filters.

BACKGROUND OF THE INVENTION

A common requirement for analog signal processing applications, such as telecommunications, is filtering. A filter alters the frequency components in a signal. For example, an analog signal may include both desired and unwanted signal components. Typically, the desired and unwanted components occupy different portions of the frequency spectrum. A filter removes the unwanted component by rejecting the signal components outside of the desired frequency band. If the frequency band of the unwanted signal is higher or lower than that of the desired components, a lowpass or highpass filter, respectively, may be used to reject the unwanted components. If the desired components occur only within a particular range of frequencies, then a bandpass filter removes unwanted components having frequencies both above and below the range of frequencies.

The availability of operational amplifiers fabricated on integrated circuits with nearly ideal characteristics simplifies filter design. Several filter types based on operational amplifiers may be used, each with its own advantages and disadvantages. For instance a simple, continuous-time filter may be constructed with an operational amplifier and additional resistors and capacitors. The values of the resistors and capacitors are chosen so that the filter has the desired frequency response. This filter type has the advantage that it provides a continuous output signal. However, resistors and capacitors formed on integrated circuits have very wide tolerances. Furthermore, the use of accurate, discrete resistors and capacitors external to the integrated circuit presents additional costs for a circuit board designer. Thus, in many applications, a discrete filter using an operational amplifier and resistors and capacitors is undesirable.

Other filter designs are available, but each presents its own problems, especially if continuous-time filtering is required. A switched-capacitor filter uses digital switching and clocking techniques and provides a frequency response based on the ratio, rather than the absolute value, of capacitors. Thus, the switched-capacitor filter is not sensitive to the wide tolerances of integrated circuit components. However, switched-capacitor filters have their own problems. In order to provide a continuous-time filter, an additional smoothing filter is needed at the output of the switched capacitor filter. A switched-capacitor filter also suffers from performance degradation for higher clock frequencies.

Another type of filter is called an operational transconductance amplifier-capacitor (OTA-C) filter. An OTA-C filter, however, is inherently nonlinear, because its transfer characteristic is typically based on either an exponential (bipolar transistor) or square-law (MOSFET) amplifier. While OTA-C filters are tunable, they have a poor dynamic range. Thus, a continuous-time, linear filter which remains accurate even under wide component tolerances is needed.

SUMMARY OF THE INVENTION

Accordingly, there is provided, in one form, a tuning circuit for continuous-time filters comprising an operational amplifier, a comparator, a successive approximation register, resistive means, and capacitive means. The operational amplifier has a positive input terminal for receiving a first reference voltage, a negative input terminal, and an output terminal. The comparator has a positive input terminal coupled to the output terminal of the operational amplifier, a negative input terminal for receiving a second reference voltage, and an output terminal for providing an output voltage. The successive approximation register has an input terminal coupled to the output terminal of the comparator, and provides a plurality of select signals corresponding to successively sampled values of the output signal. The resistive means is coupled between a reference voltage terminal and the negative input terminal of the operational amplifier. The capacitive means is coupled between the output terminal of the operational amplifier and the negative input terminal of the operational amplifier. One of the resistive means and the capacitive means includes a plurality of components corresponding to and enabled by the plurality of select signals.

In another form, there is provided a method for tuning a continuous-time filter, the continuous-time filter having at least one resistor and at least one capacitor defining a frequency response characteristic thereof. The method comprises the steps of providing a plurality of binary-weighted capacitors selectively enabled by a corresponding plurality of binary-weighted signals; enabling one of the binary-weighted capacitors, the enabled capacitor being a largest of the binary-weighted capacitors not previously enabled; integrating a reference current through the enabled binary-weighted capacitor for a predetermined time period to provide a first output signal, the reference current determined by a first reference voltage divided by a predetermined resistance value; providing a second output signal in response to the first output signal exceeding a second reference voltage; setting a binary-weighted signal corresponding to the enabled binary-weighted capacitor in response to the second output signal; repeating the steps of enabling, integrating, providing a second output signal, and setting, successively for each remaining one of the plurality of binary-weighted signals; and applying the binary-weighted signals to a corresponding plurality of capacitors in the continuous-time filter.

These and other features and advantages will be more clearly understood from the following detailed description taken in conjunction with the accompanying drawings.

DETAILED DESCRIPTION OF THE INVENTION

Figure 1:
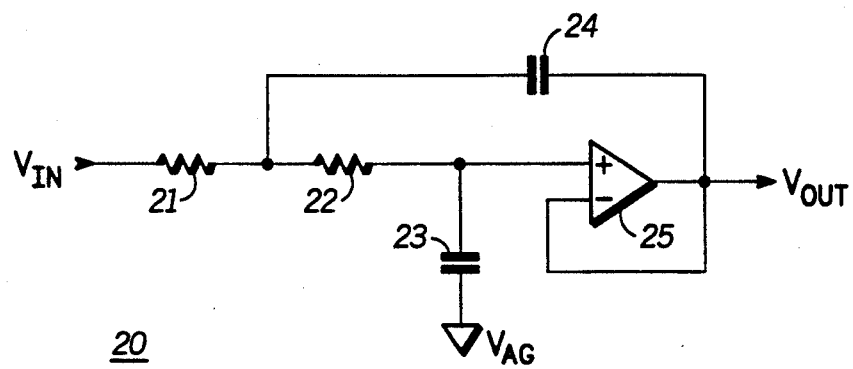
FIG. 1 illustrates in partial schematic form a conventional two-pole filter known in the prior art.

FIG. 1 illustrates in partial schematic form a conventional two-pole filter 20 known in the prior art. Filter 20 includes resistors 21 and 22, capacitors 23 and 24, and operational amplifier 25. Resistor 21 has a first terminal for receiving an input signal labelled "$V_{IN}$", and a second terminal. Resistor 22 has a first terminal connected to the second terminal of resistor 21, and a second terminal. Capacitor 23 has a first terminal connected to the second terminal of resistor 22, and a second terminal connected to a power supply voltage terminal labelled "$V_{AG}$". $V_{AG}$ is an analog ground power supply voltage terminal having a voltage which is approximately halfway between a more-positive and a more-negative power supply voltage. Capacitor 24 has a first terminal connected to the second terminal of resistor 21, and a second terminal. Operational amplifier 25 has a positive input terminal connected to the second terminal of resistor 22, a negative input terminal, and an output terminal connected to the negative input terminal of operational amplifier 25 and to the second terminal of capacitor 24, and providing a signal labelled "$V_{OUT}$" thereon.

Filter 20 is a conventional two-pole filter, known as a Sallen and Key filter. The pole frequencies of filter 20 are set by the values of resistors 21 and 22 and capacitors 23 and 24. For a DC signal component (having a frequency of zero Hz.), capacitors 23 and 24 are seen as open circuits, and operational amplifier 25 acts as a unity gain amplifier. As the frequency of a signal component increases, capacitors 23 and 24 begin to shunt current, until ultimately, very high frequency components are heavily attenuated. Thus filter 20 has a two-pole lowpass characteristic.

Figure 2:
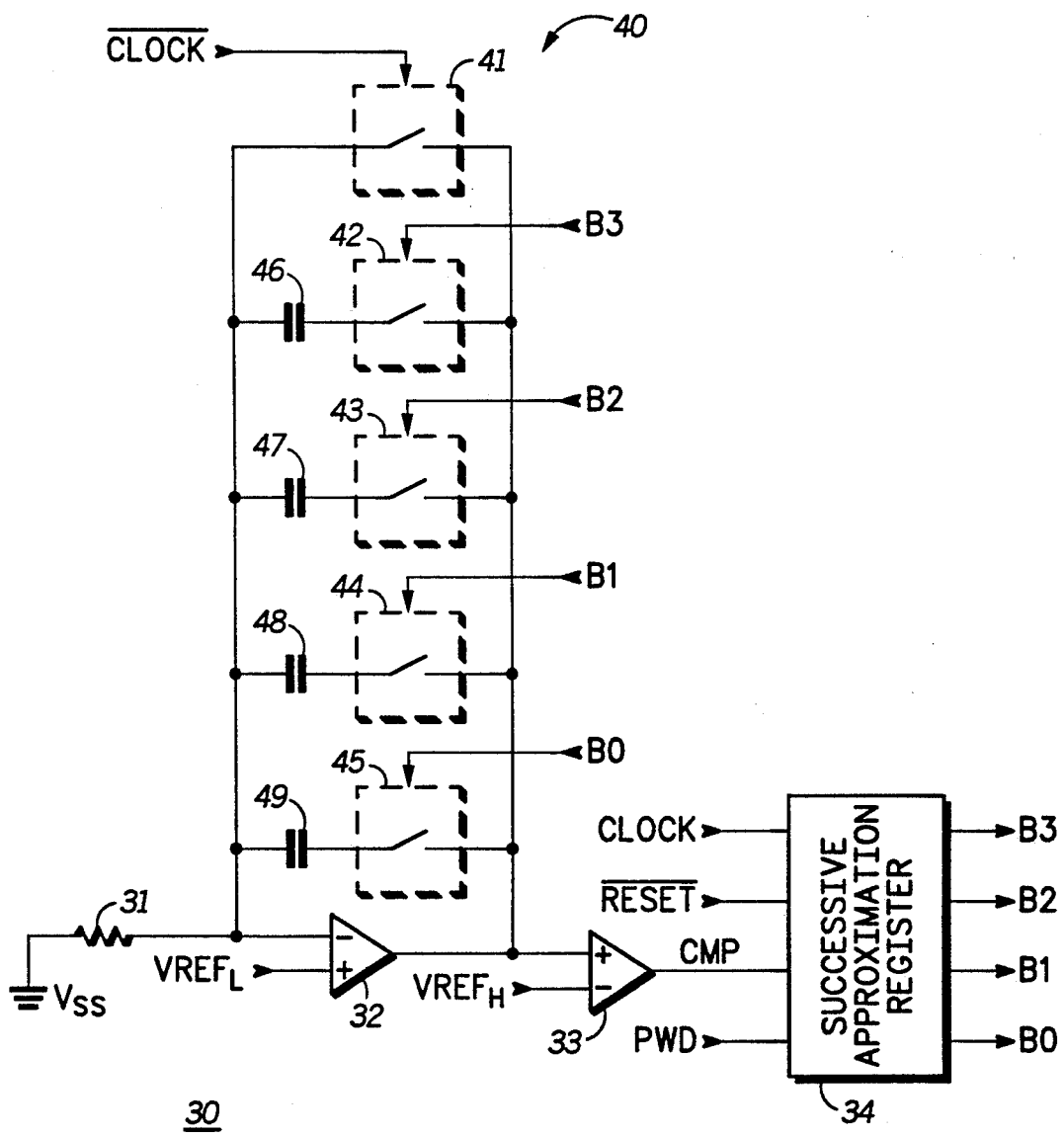
FIG. 2 illustrates in partial schematic form a tuning circuit in accordance with the present invention.

FIG. 2 illustrates in partial schematic form a tuning circuit 30 in accordance with the present invention. Tuning circuit includes generally a resistor 31, an operational amplifier 32, a comparator 33, a successive approximation register 34, and a tuning portion 40. Tuning portion 40 includes switches 41–45, and capacitors 46–49. Resistor 31 has a first terminal connected to a power supply voltage terminal labelled "$V_{SS}$", and a second terminal. $V_{SS}$ is the more-negative power supply voltage terminal having a value of approximately zero volts. Operational amplifier 32 is a conventional operational amplifier having a positive input terminal for receiving a reference voltage labelled "$VREF_L$", a negative input terminal connected to the second terminal of resistor 31, and an output terminal. $VREF_L$ is a reference voltage which is greater than $V_{SS}$. Comparator 33 is a conventional comparator having a positive input terminal connected to the output terminal of operational amplifier 32, a negative input terminal for receiving a reference voltage labelled "$VREF_H$", and an output terminal for providing a signal labelled "CMP". $VREF_H$ is a reference voltage which is greater than both $V_{SS}$ and $VREF_L$. Successive approximation register 34 has a data input terminal coupled to the output terminal of comparator 33 for receiving signal CMP thereon, a clock input terminal for receiving a clock signal labelled "CLOCK", a reset input terminal for receiving a signal labelled "$\overline{RESET}$", a power-down indication input terminal for receiving a signal labelled "PWD", and four output terminals for providing binary-weighted signals labelled "B3", "B2", "B1", and "B0". Note that the same circuit symbols are used for operational amplifier 32 and comparator 33, because comparator 33 is analogous to an operational amplifier connected in an open loop configuration, with a positive difference between the positive and negative input terminals thereof providing an output voltage clamped to the positive power supply voltage, and negative difference between the positive and negative input voltages clamped to the negative power supply. It should be apparent to those skilled in the art that there may be actual differences between operational amplifier 32 and comparator 33, such as Miller compensation.

Tuning portion 40 is connected between the output terminal and the negative input terminal of operational amplifier 32. Switch 41 has a first terminal, a second terminal connected to the output terminal of operational amplifier 22, and is activated or closed in response to a signal labelled "$\overline{CLOCK}$". Switch 42 has a first terminal, a second terminal connected to the output terminal of operational amplifier 32, and is activated or closed in response to a signal labelled "B3". Switch 43 has a first terminal, a second terminal connected to the output terminal of operational amplifier 32, and is activated or closed in response to a signal labelled "B2". Switch 44 has a first terminal, a second terminal connected to the output terminal of operational amplifier 32, and is activated or closed in response to a signal labelled "B1". Switch 45 has a first terminal, a second terminal connected to the output terminal of operational amplifier 32, and is activated or closed in response to a signal labelled "B0". Capacitor 46 has a first terminal connected to the negative input terminal of resistor 31, and a second terminal connected to the first terminal of switch 42. Capacitor 47 has a first terminal connected to the negative input terminal of resistor 31, and a second terminal connected to the first terminal of switch 43. Capacitor 38 has a first terminal connected to the negative input terminal of resistor 31, and a second terminal connected to the first terminal of switch 44. Capacitor 39 has a first terminal connected to the negative input terminal of resistor 31, and a second terminal connected to the first terminal of switch 45.

Signal $\overline{RESET}$ is first activated at a logic low. The tuning cycle begins when signal $\overline{RESET}$ is inactivated. Signal B3 is initially set to a logic high, and signals B2, B1, and B0 are each set to a logic low. Thus, switch 42 is closed and switches 43–45 are open. The tuning cycle lasts for "N" clock cycles, where N refers to the number of capacitor elements and corresponding binary-weighted signals. In the illustrated embodiment, N=4. When signal CLOCK is at a logic low ($\overline{CLOCK}$ at a logic high), switch 41 is closed, shorting the output terminal of operational amplifier 32 to the negative input terminal thereof. The voltage at the negative input terminal is set to be $VREF_L$. Since the positive input terminal of comparator 33 is at $VREF_L$, which is less than signal $VREF_H$, comparator 34 provides signal CMP at a logic low.

When signal CLOCK switches to a logic high, switch 41 opens, and only switch 42 is closed. Thus, during the period in which signal CLOCK is at a logic high, an integration is performed. The current, labelled I, drawn out of the first terminal of capacitor 46 is equal to ($VREF_L/R_{31}$), where $R_{31}$ designates the resistance of resistor 31. If, during the half-cycle in which CLOCK is a logic high, the voltage at the output terminal of operational amplifier 32 exceeds $VREF_H$, then the output of comparator 33, signal CMP, becomes active. This is expressed as:

$$\begin{aligned} \Delta t &= C\Delta V/I \\ &= C(VREF_H - VREF_L)/(VREF_L/R_{31}) \\ &= R_{31}C(VREF_H - VREF_L)/VREF_L \end{aligned}$$

where $\Delta t$ is the time required to switch comparator 33, and C is the value of capacitance between the output terminal of operational amplifier 32 and the input terminal thereof. Thus, if $\Delta t$ is less than the half-cycle of signal CLOCK, then signal CMP is activated.

If signal CMP is not activated during the first period of signal CLOCK after signal $\overline{RESET}$ becomes inactive, then the value of the capacitor 46 is too large, and successive approximation register 34 inactivates signal B3. If, on the other hand, during the half-cycle of CLOCK, the voltage at the output terminal of operational amplifier 32 does exceed $VREF_H$, then CMP is activated and successive approximation register 34 keeps signal B3 active, indicating that capacitor 46 is not large enough. In successive cycles, in a like manner, the values of the other binary-weighted signals B2-B0 are determined.

Capacitors 46-49 are binary-weighted capacitors. If the capacitance of capacitor 49 is labelled "$C_{49}$", then the capacitance of capacitor 48 is equal to $(2)(C_{49})$, the capacitance of capacitor 47 is equal to $(4)(C_{49})$, and the capacitance of capacitor 46 is equal to $(8)(C_{49})$. An initial capacitance value of $(8)(C_{49})$ is used in the integrator. If this value is too large, then the corresponding binary-weighted signal from successive approximation register 34, signal B3, is deactivated and switch 46 is opened. A second, subsequent integration cycle then determines whether capacitor 47, having a value of $(4)(C_{49})$, should be included. Capacitor 47, along with capacitor 46 if previously activated, is included in the integration. The result of this integration determines whether signal B2 is set. The integration process is repeated until, at the end of four CLOCK cycles, a code on signals B3-B0 is developed which corresponds to a combination of capacitors which most closely integrates a current $(I=VREF_L/R_{31})$ such that the output of operational amplifier 32 most nearly equals $VREF_H$ at the end of a half CLOCK cycle. In other embodiments, other types of component weighting, such as logarithmic- or linear-weighting, may be used.

The location of a pole frequency of a filter depends on the product of a resistance and a capacitance, known as the RC product. In order to set the pole frequency to a particular value, it is necessary to maintain a predetermined value for the RC product. However, in integrated circuit processing, the values of resistors and capacitors may vary within a wide range. Tuning circuit 30 adjusts the capacitance between the output terminal and the negative input terminal of operational amplifier 32 until the actual capacitance (represented by the combination of capacitors 46-69 activated by their corresponding binary-weighted signals B3-B0) times the actual resistance ($R_{31}$) equals the desired RC product, to a resolution of the smallest-valued capacitor in tuning portion 40. The binary weights applied to tuning portion 40 then may be applied to a capacitor array in a filter circuit to place the desired pole frequencies. As $\Delta t$ is adjusted by tuning, a desired value for $R_{31}C$ is obtained; reference voltages $VREF_H$ and $VREF_L$ are predetermined reference voltages provided by high-precision bandgap voltage reference circuits. Thus, the desired value of the RC product is obtained despite wide variations in component values. In the preferred embodiment, the value of the resistors and capacitors are set such that the nominal value of the product of capacitor 47 and resistor 31, $(4)(C_{49})(R_{31})$, is equal to the desired value of the RC product. Thus, tuning circuit 30 is able to adjust the RC product to between $(1)(C_{49})(R_{31})$ and $(8+4+2+1)(C_{49})(R_{31})$ with a resolution of $(1)(C_{49})(R_{31})$.

It should be noted that a parallel combination of resistors, rather than capacitors, selectively enabled to provide a desired RC product, may also be used. Since in the illustrated embodiment, capacitors in tuning portion 40 require less integrated circuit area than corresponding resistors, capacitive tuning portion 40 is preferred. Also, switches 41-45 may be variously implemented using known switching elements. For example, MOS transistors receiving either one of the binary-weighted coefficients or signal $\overline{CLOCK}$ on their gates, may be used as switches 41-45.

Figure 3:
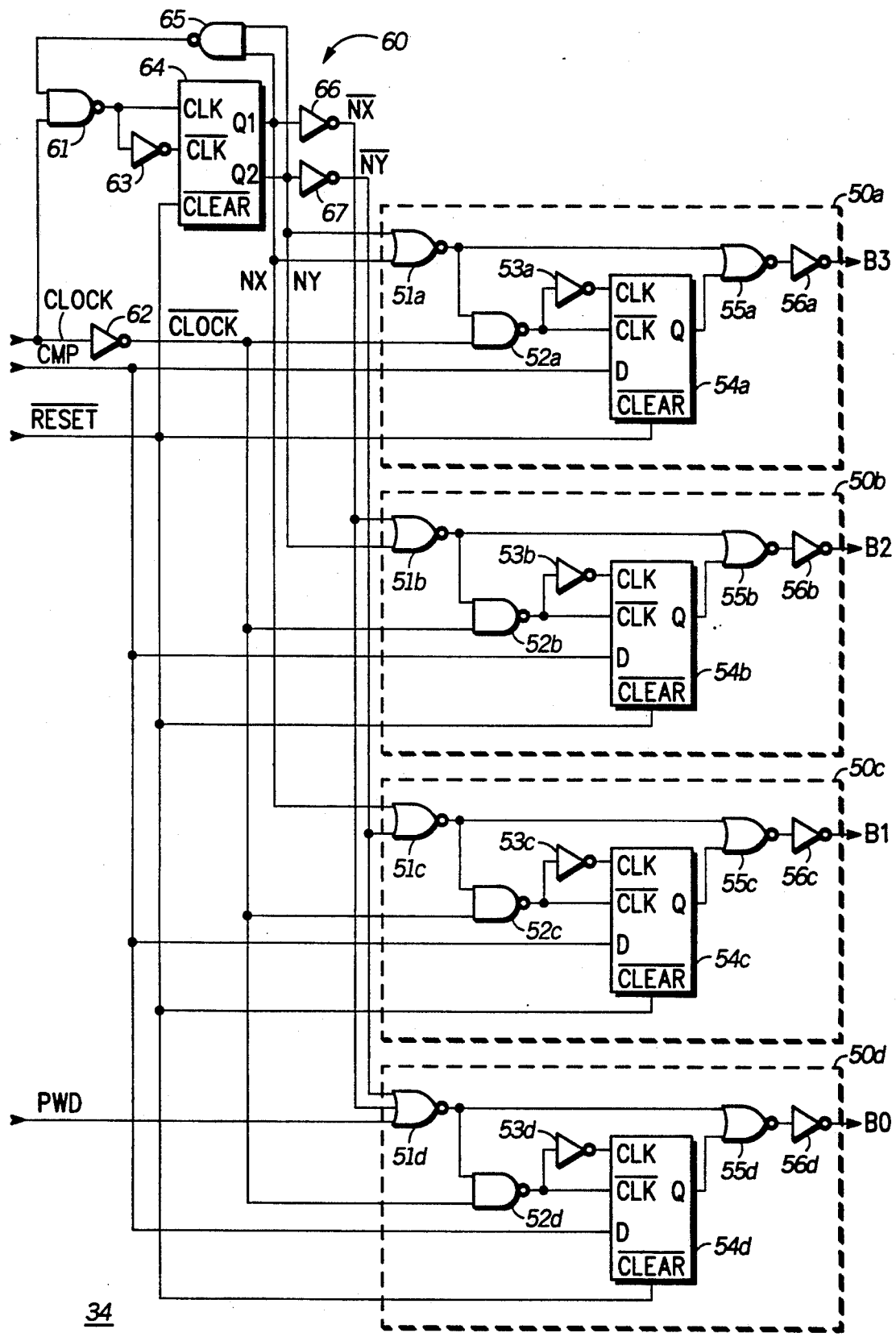
FIG. 3 illustrates in partial schematic form the successive approximation register of FIG. 1.

FIG. 3 illustrates in partial schematic form successive approximation register 34 of FIG. 2. Successive approximation register 34 includes generally bit portions 50a, 50b, 50c, and 50d, and a logic portion 60. Bit portions 50a, 50b, 50c, and 50d are circuits identical except for a single exception which will be noted below. Thus, the reference numbers are assigned generically, and the circuitry and operation of each will be described with respect to bit portion 50a. Bit portion 50a includes NOR gate 51a, a NAND gate 52a, an inverter 53a, a D-flip flop 54a, a NOR gate 55a, and an inverter 56a. Logic portion 60 includes a NAND gate 61, inverters 62 and 63, a two-bit counter 64, a NAND gate 65, and inverters 66 and 67.

In bit portion 50a, NOR gate 51a has a first input terminal for receiving signal NX, a second input terminal for receiving signal NY, and an output terminal. NAND gate 52a has a first input terminal connected to the output terminal of NOR gate 51a, a second input terminal for receiving signal $\overline{CLOCK}$, and an output terminal. Inverter 53a has an input terminal connected to the output terminal of NAND gate 52a, and an output terminal. Flip flop 54a has true and complement clock input terminals labelled "CLK" and "$\overline{CLK}$" and respectively connected to the output terminals of inverter 53a and NAND gate 52a, a D input for receiving signal CMP, a $\overline{CLEAR}$ input for receiving signal $\overline{RESET}$, and an output terminal labelled "Q". NOR gate 55a has a first input terminal connected to the output terminal of NOR gate 51a, a second input terminal connected to the Q output of flip flop 54a, and an output terminal. Inverter 56a has an input terminal connected to the output terminal of NOR gate 55a, and an output terminal for providing signal B3.

Bit portion 50b is identical to bit portion 50a; however, NOR gate 51b receives signals $\overline{NX}$ and NY, and NOR gate 55b provides signal B2. Bit portion 50c is identical to bit portion 50a; however, NOR gate 51c receives signals NX and $\overline{NY}$, and NOR gate 55c provides signal B1. Bit portion 50d is identical to bit portion 50a with one exception: NAND gate 51d has three inputs, including signals $\overline{NX}$, $\overline{NY}$, and PWD. NOR gate 55c provides signal B0.

In logic portion 60, NAND gate 61 has a first input terminal, a second input terminal for receiving signal CLOCK, and an output terminal. Inverter 62 has an input terminal for receiving signal CLOCK, and an output terminal for providing a signal labelled $\overline{CLOCK}$. Inverter 63 has an input terminal connected to the output terminal of NAND gate 61, and an output terminal.

Counter 64 has true and complement clock input terminals, labelled "CLK" and "$\overline{\text{CLK}}$", a clear input terminal labelled "CLEAR", and two output terminals labelled "Q1" and "Q2" providing signals respectively labelled "NX" and "NY" thereon. NAND gate 65 has a first input terminal for receiving signal NX, a second input terminal for receiving signal NY, and an output terminal connected the first input terminal of NAND gate 61. Inverter 66 has an input terminal for receiving signal NX, and an output terminal for providing a signal labelled "$\overline{\text{NX}}$". Inverter 67 has an input terminal for receiving signal NY, and an output terminal for providing a signal labelled "$\overline{\text{NY}}$".

When signal $\overline{\text{RESET}}$ is activated, counter 44 and flip-flops 54a, 54b, 54c, and 54d are cleared, setting their respective Q outputs to a logic low. Signals NX and NY are set to zero. The output of NOR gate 51a, but not of NOR gates 51b, 51c, and 51d, is set to a logic high. The logic high at the input of NOR gate 55a forces its output to a logic low, setting signal B3 to a logic high. However, signals B2, B1, and B0 remain at a logic low. During the first period of CLOCK following reset, the output of B3 is set by the logic state of signal CMP. If CMP is at a logic high, signifying the value of the capacitor corresponding to signal B3 is too low, then the output Q of flip-flop 54a is set to a logic high, keeping the output of NOR gate 55a at a logic low and forcing B3 to remain active at a logic high. B3 will remain at a logic high until further reset.

During the second period of CLOCK, signals $\overline{\text{NX}}$ and NY are at a logic low, making the output of NOR gate 51b active at a logic high, and causing signal B2 to be active at a logic high. During the second period of CLOCK, the value of CMP is latched in flip-flop 54b. Likewise, the value of CMP is latched in flip-flops 54c and 54d in subsequent periods of CLOCK, and at the end of four periods of CLOCK the tuning cycle is complete.

In the illustrated embodiment, four binary-weighted signals and capacitors with corresponding binary-weighted values were used to tune a capacitive value to provide the desired RC product. Two alternative embodiments should be obvious to one of ordinary skill in the art. First, a larger number of signals and corresponding capacitors could be used to cover a wider range of variation of component values or to provide a greater precision. Second, as noted earlier, another pattern of capacitive weights besides a binary progression, such as logarithmic or linear, may be used.

Figure 4:
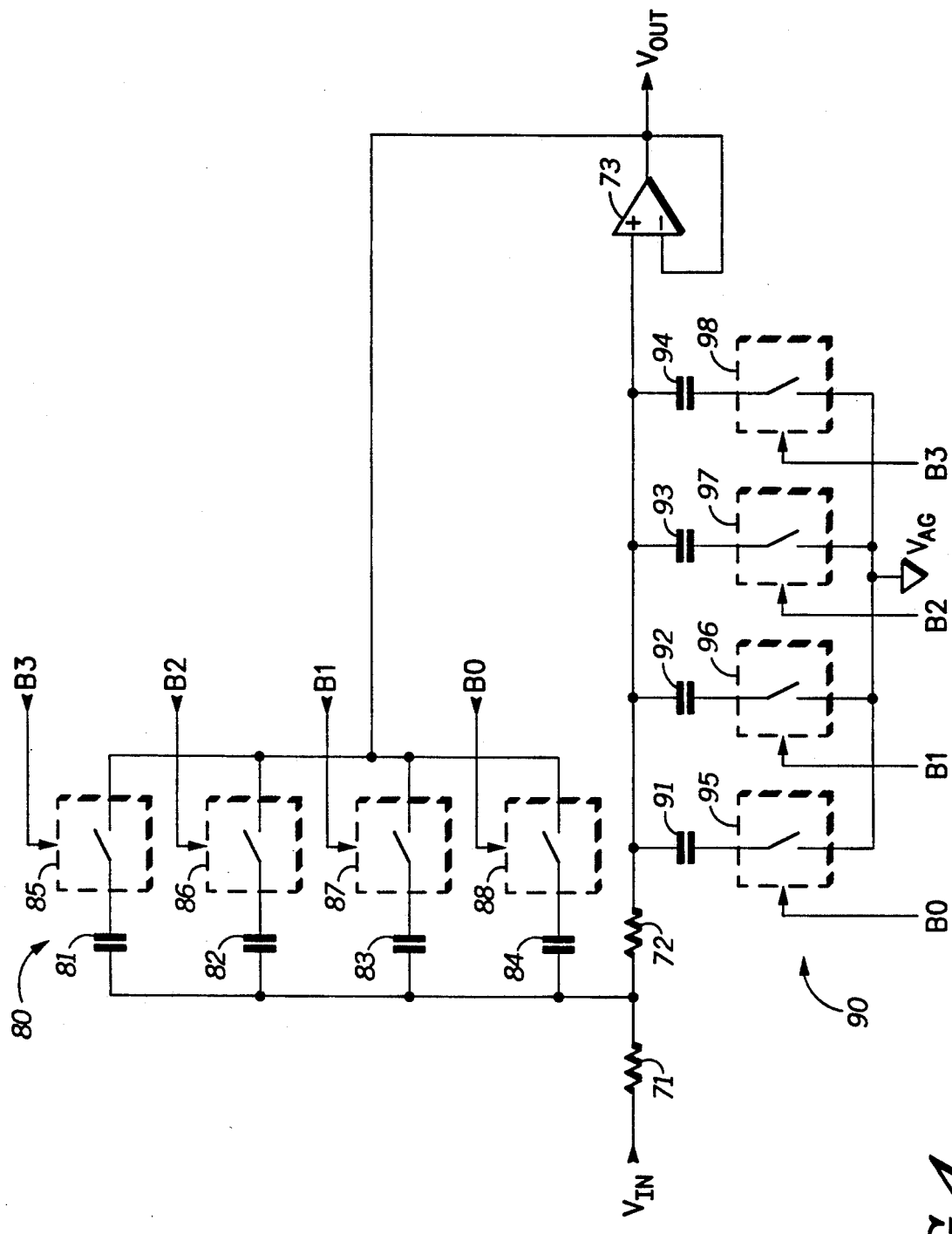
FIG. 4 illustrates in partial; schematic form a continuous-time filter for use with the tuning circuit of FIG. 1 in accordance with the present invention.

FIG. 4 illustrates in partial schematic form a continuous-time filter 70 for use with tuning circuit 30 of FIG. 2 in accordance with the present invention. Filter 70 includes generally resistors 71 and 72, an operational amplifier 73, a first tuned capacitor portion 80, and a second tuned capacitor portion 90. Tuned capacitor portion 80 includes capacitors 81-84 and switches 85-88. Tuned capacitor portion 90 includes capacitors 91-94 and switches 95-98.

Resistor 71 has a first terminal for receiving $V_{IN}$, and a second terminal. Resistor 72 has a first terminal connected to the second terminal of resistor 71, and a second terminal. Operational amplifier 73 has a positive input terminal connected to the second terminal of resistor 72, a negative input terminal, and an output terminal for providing signal $V_{OUT}$ and connected to the negative output terminal of operational amplifier 73. Tuned capacitor portion 80 is connected between the output terminal of operational amplifier 73, and the second terminal of resistor 71. In tuned capacitor portion 80, capacitors 81-84 each have a first terminal connected to the second terminal of resistor 71, and a second terminal. Switch 85 has a first terminal connected to the second terminal of capacitor 81, a second terminal connected to the output terminal of operational amplifier 73, and is activated or closed by signal B3. Switch 86 has a first terminal connected to the second terminal of capacitor 82, a second terminal connected to the output terminal of operational amplifier 73, and is activated or closed by signal B2. Switch 87 has a first terminal connected to the second terminal of capacitor 83, a second terminal connected to the output terminal of operational amplifier 73, and is activated or closed by signal B1. Switch 88 has a first terminal connected to the second terminal of capacitor 84, a second terminal connected to the output terminal of operational amplifier 73, and is activated or closed by signal B0.

Tuned capacitor portion 90 is connected between the positive input terminal of operational amplifier 73 and $V_{AG}$. In tuned capacitor portion 90, capacitors 91-94 each have a first terminal connected to the positive input terminal of operational amplifier 73, and a second terminal. Switch 95 has a first terminal connected to the second terminal of capacitor 91, a second terminal connected to $V_{AG}$, and is activated or closed in response to signal B0. Switch 96 has a first terminal connected to the second terminal of capacitor 92, a second terminal connected to $V_{AG}$, and is activated or closed in response to signal B1. Switch 97 has a first terminal connected to the second terminal of capacitor 93, a second terminal connected to $V_{AG}$, and is activated or closed in response to signal B2. Switch 98 has a first terminal connected to the second terminal of capacitor 94, a second terminal connected to $V_{AG}$, and is activated or closed in response to signal B3.

It should be readily apparent that filter 70 is directly analogous to filter 20 of FIG. 1. The only difference is that capacitor portion 80 replaces capacitor 24 of FIG. 1, and capacitor portion 90 replaces capacitor 23 of FIG. 1. The sizes of the capacitors in portions 80 and 90 correspond to the sizes of capacitors in tuning circuit 30 of FIG. 2 Thus, the value of capacitors 81 and 94, switched by signal B3, are each equal to the value of capacitor 46 in FIG. 2; the values of capacitor 82 and 93, switched by signal B2, are each equal to the value of capacitor 47 in FIG. 2; and so on. In addition, the value of resistor 71 is equal to the value of resistor 31 in FIG. 2. The binary-weighted coefficients tuned by circuit 30 in FIG. 2 are applied to corresponding switches in FIG. 4, to provide an active two-pole filter whose pole frequencies are precisely controlled. Tuning circuit 30 used in conjunction with filter 70 takes advantage of the characteristic that the values of integrated circuit resistors and capacitors, while having wide tolerances, match very accurately if they are of the same type, orientation, and proximity on the integrated circuit. The inherent problem of integrated circuit component variation is efficiently overcome to provide an improved continuous-time filter.

While the invention has been described in the context of a preferred embodiment, it will be apparent to those skilled in the art that the present invention may be modified in numerous ways and may assume many embodiments other than that specifically set out and described above. For example, tuning circuit 30 may be used with a variety of filter types and with different order filters, and works with both passive and active filters based on RC time constants. Many variations of successive approximation register 34 may be used. In addition, different types of switches may be used. Accordingly, it is intended by the appended claims to cover all modifications of the invention which fall within the true spirit and scope of the invention.

I claim:

1. A tuning circuit for continuous-time filters comprising:
   an operational amplifier having a positive input terminal for receiving a first reference voltage, a negative input terminal, and an output terminal;
   a comparator having a positive input terminal coupled to said output terminal of said operational amplifier, a negative input terminal for receiving a second reference voltage, and an output terminal for providing an output voltage;
   a successive approximation register having an input terminal coupled to said output terminal of said comparator, for providing a plurality of select signals corresponding to successively sampled values of said output signal;
   resistive means coupled between a reference voltage terminal and said negative input terminal of said operational amplifier; and
   capacitive means coupled between said output terminal of said operational amplifier and said negative input terminal of said operational amplifier,
   one of said resistive means and said capacitive means including a plurality of components corresponding to and enabled by said plurality of select signals.

2. The tuning circuit of claim 1 further comprising means for coupling said output terminal of said operational amplifier to said negative input terminal of said operational amplifier in response to a clock signal.

3. The tuning circuit of claim 1 wherein each of said plurality of components has a corresponding binary weight.

4. The tuning circuit of claim 1 wherein said plurality of components comprises a plurality of capacitors.

5. The tuning circuit of claim 1 wherein said second reference voltage exceeds said first reference voltage.

6. The tuning circuit of claim 1 wherein said reference voltage terminal comprises an analog ground power supply voltage terminal.

7. A tuning circuit for continuous-time filters comprising:
   an operational amplifier having a positive input terminal for receiving a first reference voltage, a negative input terminal coupled through a resistor to a power supply voltage terminal, and an output terminal;
   a comparator having a positive input terminal coupled to said output terminal of said operational amplifier, a negative input terminal for receiving a second reference voltage, and an output terminal for providing an output voltage;
   a successive approximation register having an input terminal coupled to said output terminal of said comparator, for providing a plurality of binary-weighted output signals in response to successively sampled values of said output signal;
   means for coupling selected ones of a plurality of capacitors having binary weights corresponding to said binary-weighted output signals in response to activated ones of said binary-weighted output signals, said capacitors coupled in parallel between said output terminal of said operational amplifier and said negative input terminal of said operational amplifier; and
   means for coupling said output terminal of said operational amplifier to said negative input terminal of said operational amplifier in response to a clock signal.

8. The tuning circuit of claim 7 wherein said means for coupling said output terminal comprises a switch having a first terminal coupled to said output of said operational amplifier, and a second terminal coupled to said negative input terminal of said operational amplifier, said second switch activated by said clock signal.

9. The tuning circuit of claim 7 wherein said means for coupling selected ones of a plurality of capacitors comprises:
   a first plurality of switches each having a first terminal coupled to said output terminal of said operational amplifier, and a second terminal, and activated by a corresponding one of said binary-weighted output signals,
   said plurality of capacitors each having a first terminal coupled to said second terminal of a corresponding switch of said first plurality of switches, and a second terminal coupled to said negative input terminal of said operational amplifier.

10. The tuning circuit of claim 9 wherein said means for coupling said output terminal comprises a second switch having a first terminal coupled to said output terminal of said operational amplifier, and a second terminal coupled to said negative input terminal of said operational amplifier, said second switch activated by said clock signal.

11. A continuous-time filter comprising:
   a first operational amplifier having positive and negative input terminals and an output terminal coupled to said negative input terminal of said first operational amplifier and providing a filtered output signal thereon;
   a resistor having a first terminal coupled to an input node, and a second terminal coupled to said positive input terminal of said first operational amplifier;
   first feedback means for selectively coupling a first plurality of binary-weighted capacitors between said input node and said output terminal of said first operational amplifier in response to a plurality of binary-weighted output signals;
   second feedback means for selectively coupling a second plurality of binary-weighted capacitors between said positive input terminal of said first operational amplifier and a power supply voltage terminal, in response to said plurality of binary-weighted signals; and
   tuning means for providing said binary weights, comprising:
      a second resistor having a first terminal coupled to said power supply voltage terminal, and a second terminal;
      a second operational amplifier having positive input terminal for receiving a first reference voltage, a negative input terminal coupled to said second terminal of said second resistor, and an output terminal;
      a comparator having a positive input terminal coupled to said output terminal of said second operational amplifier, a negative input terminal for receiving a second reference voltage, and an output terminal;

a successive approximation register having an input terminal coupled to said output terminal of said comparator, for providing said plurality of binary-weighted output signals in response to successively sampled values of said output signal;

means for coupling selected ones of a plurality of capacitors having binary weights corresponding to said binary-weighted output signals in response to activated ones of said binary-weighted output signals between said output terminal of said second operational amplifier and said negative input terminal of said second operational amplifier; and means for coupling said output terminal of said second operational amplifier to said negative input terminal of said second operational amplifier in response to a clock signal.

12. The continuous-time filter of claim 11 further comprising a third resistor having a first terminal for receiving an input signal, and a second terminal coupled to said input node.

13. A method for tuning a continuous-time filter, the continuous-time filter having at least one resistor and at least one capacitor defining a frequency response characteristic thereof, comprising the steps of:

providing a plurality of binary-weighted capacitors selectively enabled by a corresponding plurality of binary-weighted signals;

enabling one of said binary-weighted capacitors, said enabled capacitor being a largest of said binary-weighted capacitors not previously enabled;

integrating a reference current through said enabled binary-weighted capacitor for a predetermined time period to provide a first output signal, said reference current determined by a first reference voltage divided by a predetermined resistance value;

providing a second output signal in response to said first output signal exceeding a second reference voltage;

setting a binary-weighted signal corresponding to said enabled binary-weighted capacitor in response to said second output signal;

repeating said steps of enabling, integrating, providing a second output signal, and setting, successively for each remaining one of said plurality of binary-weighted signals; and applying said binary-weighted signals to a corresponding plurality of capacitors in the continuous-time filter.

* * * * *